(12) United States Patent
Chow et al.

(10) Patent No.: US 7,598,599 B2
(45) Date of Patent: Oct. 6, 2009

(54) SEMICONDUCTOR PACKAGE SYSTEM WITH SUBSTRATE HAVING DIFFERENT BONDABLE HEIGHTS AT LEAD FINGER TIPS

(75) Inventors: Seng Guan Chow, Singapore (SG); Ming Ying, Singapore (SG); Il Kwon Shim, Singapore (SG); Lip Seng Tan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 384 days.

(21) Appl. No.: 11/276,681

(22) Filed: Mar. 9, 2006

(65) Prior Publication Data

US 2007/0210422 A1 Sep. 13, 2007

(51) Int. Cl.
*H01L 23/495* (2006.01)
(52) U.S. Cl. ............... 257/666; 257/670; 257/674; 257/E23.031; 257/E23.032; 257/E23.037
(58) Field of Classification Search ......... 257/666–677, 257/E23.004, E23.031–E23.059
See application file for complete search history.

(56) References Cited

U.S. PATENT DOCUMENTS

| 4,949,160 | A | * | 8/1990 | Ohno | ............... 257/668 |
|---|---|---|---|---|---|
| 6,069,408 | A | | 5/2000 | Honda et al. | |
| 6,161,753 | A | | 12/2000 | Tsai et al. | |
| 6,176,416 | B1 | | 1/2001 | Tsai et al. | |
| 6,297,078 | B1 | | 10/2001 | Barrow | |
| 6,391,759 | B1 | | 5/2002 | Chao et al. | |
| 6,476,506 | B1 | | 11/2002 | O'Connor et al. | |
| 6,812,580 | B1 | | 11/2004 | Wenzel et al. | |
| 6,847,122 | B1 | | 1/2005 | Batish et al. | |
| 6,861,734 | B2 | * | 3/2005 | Minamio et al. | ............ 257/666 |
| 6,995,459 | B2 | * | 2/2006 | Lee et al. | ............ 257/676 |
| 7,339,258 | B2 | * | 3/2008 | Punzalan et al. | ............ 257/666 |

* cited by examiner

*Primary Examiner*—Jasmine J Clark
(74) *Attorney, Agent, or Firm*—Mikio Ishimaru

(57) ABSTRACT

A semiconductor package system is provided. A substrate having a die attach paddle is provided. A first plurality of leads is provided around the die attach paddle having a first plurality of lead tips. A second plurality of leads is provided around the die attach paddle interleaved with the first plurality of leads, at least some of the second plurality of leads having a plurality of depression lead tips. A first die is attached to the die attach paddle. The die is wire bonded to the first plurality of leads and the second plurality of leads. The die is encapsulated.

18 Claims, 8 Drawing Sheets

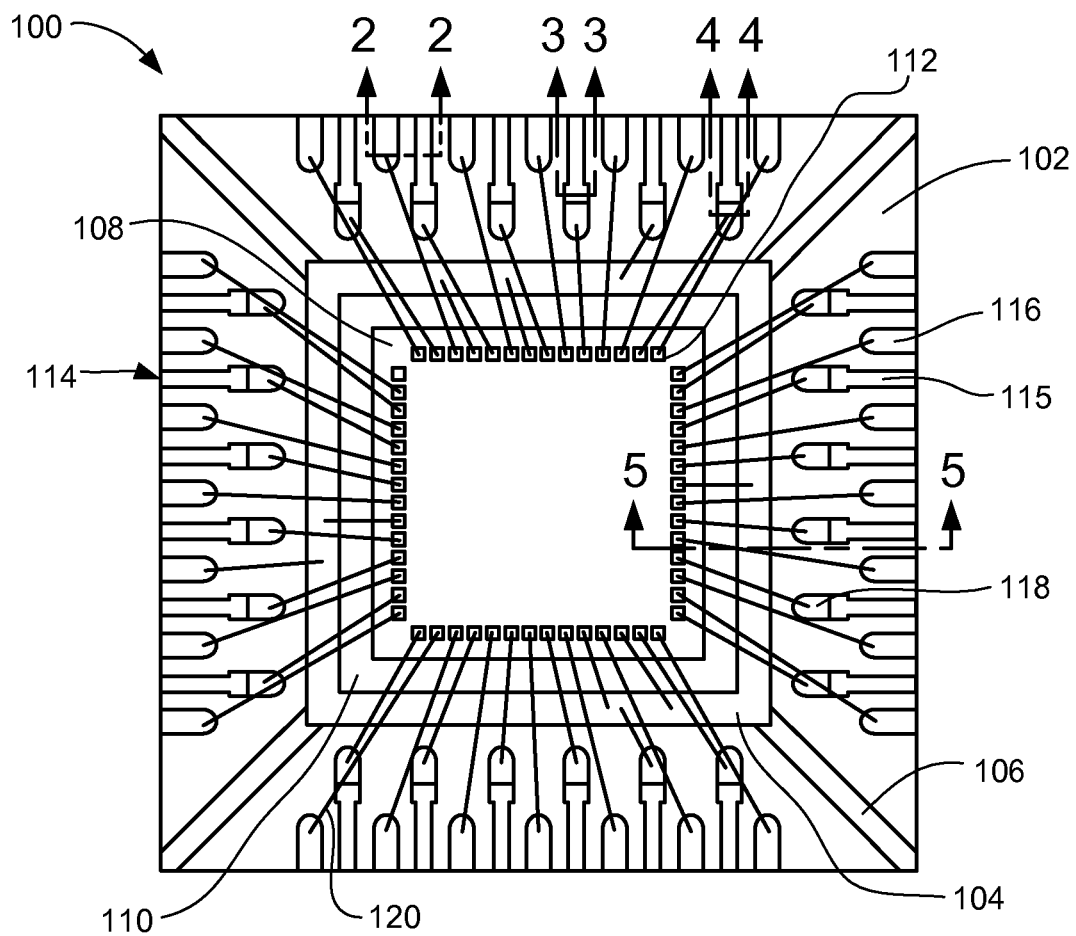
FIG. 1
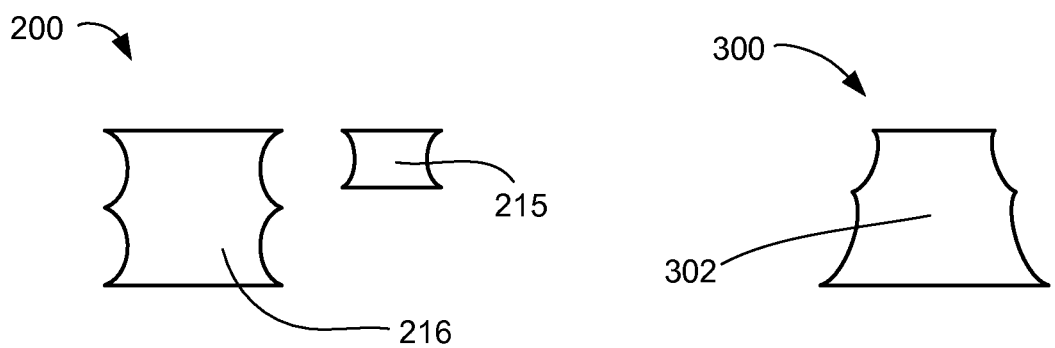
FIG. 2
FIG. 3
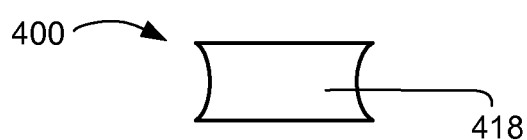
FIG. 4

SEMICONDUCTOR PACKAGE SYSTEM WITH SUBSTRATE HAVING DIFFERENT BONDABLE HEIGHTS AT LEAD FINGER TIPS

TECHNICAL FIELD

The present invention relates generally to semiconductor package systems, and more particularly to a method and apparatus for a semiconductor package system having a dual rows of leads.

BACKGROUND ART

In the electronics industry, the tendency has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board.

Typically, the packages on which these integrated circuit chips are mounted include a substrate or other chip mounting device. One example of such a substrate is a leadframe. High performance leadframes typically are multi-layer structures including power, ground, and signal planes.

Leadframes also typically include at least an area on which an integrated circuit chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Leadframes have been used extensively in the integrated circuit packaging industry mainly because of their low manufacturing cost and high reliability. Leadframe packages remain a cost-effective solution for packaging integrated circuits despite the introduction of various leadless packages in recent years.

Typical leadframe packages include a die attach paddle, or pad, surrounded by a number of leads. The leads are temporarily attached to the die attach paddle by a number of tie bars connected to an outer leadframe. An integrated circuit chip, is attached to the die attach paddle using a conductive adhesive such as silver epoxy. The conductive adhesive is cured after die attach. After the die is attached to the die paddle, a wire-bonding process is used to make electrical interconnections between the integrated circuit and the leads of the leadframe. After wire bonding, the leadframe with the integrated circuit attached is encapsulated using a molding compound.

Such enclosures may include encapsulation in a plastic or a multi-part housing made of plastic ceramic, or metal. The enclosure protects the leadframe and the attached chip from physical, electrical, and/or chemical damage. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

As integrated circuits have become smaller with increased performance capabilities leadframes for integrated circuits have been adapted to accommodate these integrated circuits. A staggered dual row leadframe has found increased use to provide additional leads on a leadframe of a given size. The dual row leadframe includes an inner row of leads and an outer row of leads surrounding a pad to which the integrated circuit die is attached. The contact pads on the integrated circuit are connected to the inner and the outer rows of leads with bonding wires in accordance with the particular design of the semiconductor package.

One problem that persists with dual row leadframes is that dual row leadframes have an increased tendency to result in wires crossing causing electrical shorts and wire sweep thereby causing failures of the semiconductor packages.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system. A substrate having a die attach paddle is provided. A first plurality of leads is provided around the die attach paddle having a first plurality of lead tips. A second plurality of leads is provided around the die attach paddle interleaved with the first plurality of leads, at least some of the second plurality of leads having a plurality of depression lead tips. A first die is attached to the die attach paddle. The die is wire bonded to the first plurality of leads and the second plurality of leads. The die is encapsulated.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a plan view of a semiconductor package system at an intermediate stage of manufacture in accordance with an embodiment of the present invention;

FIG. 2 is an enlarged view of a portion of the structure of FIG. 1 taken along line 2-2;

FIG. 3 is an enlarged view of a portion of the structure of FIG. 1 taken along line 3-3;

FIG. 4 is an enlarged view of a portion of the structure of FIG. 1 taken along line 4-4;

BEST MODE FOR CARRYING OUT THE INVENTION

Figure 5:
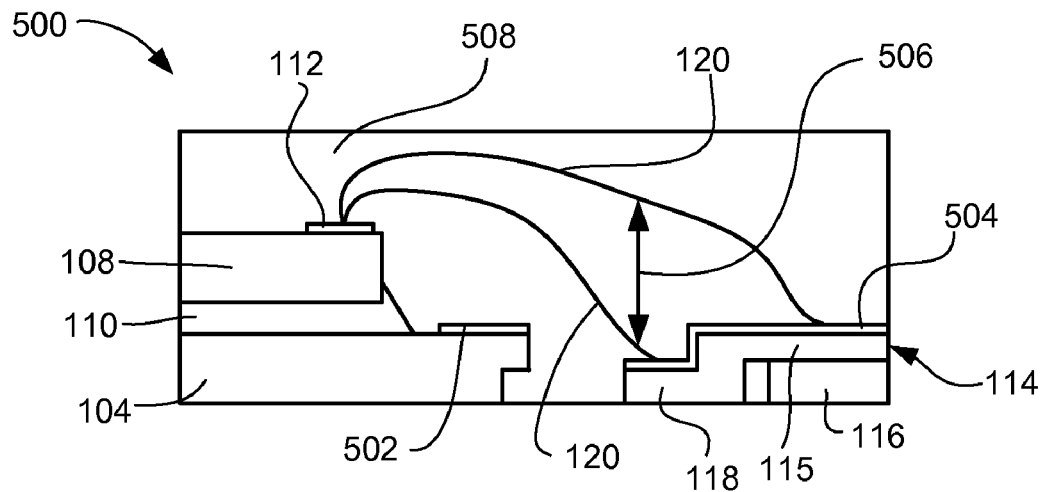
FIG. 5 is a cross-sectional view of a portion of the structure of FIG. 1 taken along line 5-5.

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the present invention are semi-diagrammatic and not to scale and, particularly, some of the dimensions are for the clarity of presentation and are shown greatly exaggerated in the FIGs. Generally, the device can be operated in any orientation. Also, where multiple embodiments are disclosed and described having some features in common, for clarity and ease of illustration and description thereof, like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a plan view of a semiconductor package system 100 at an intermediate stage of manufacture in accordance with an embodiment of the present invention. The semiconductor package system 100 includes a leadframe 102. The leadframe 102 has a die attach paddle 104 centrally located in the leadframe 102. The die attach paddle 104 is connected to the leadframe 102 by a number of tie bars 106 attached to the corners of the die attach paddle 104. A die 108 is attached to the die attach paddle 104 using a die attach adhesive 110. The die attach adhesive 110 is applied to the die attach paddle 104 in a conventional manner such as by applying an adhesive tape or dispensing an adhesive liquid or paste that is subsequently cured. The adhesive 110 can be either electrically conductive or non-conductive as required in a particular application. The die has a number of bonding pads 112 positioned around the outer edge of the die 108.

A number of inner leads 114 is positioned around the periphery of the die attach paddle 104. Interleaved between the inner leads 114 is a number of outer leads 116. The outer leads 116 comprise a first plurality of leads, and the inner leads 114 comprise a second plurality of leads. The inner leads 114 include a number of inner lead stems 115 and a number of depression lead tips 118 attached thereto. The depression lead tips 118 are formed during the process of manufacturing the leadframe 102, such as by etching.

The bonding pads 112 on the die 108 are electrically connected to the inner leads 114, the outer leads 116, and the die attach paddle 104 as required for the semiconductor package 100 by a number of bond wires 120 as required for a particular design. Each of the number of bond wires 120 is a fine, conductive wire, such as gold (Au), aluminum (Al), or other conductive wire. The number of bonding wires 120 is attached between the number of bonding pads 112 on one hand, and the inner leads 114, the outer leads 116, and the die attach paddle 104 on the other hand, using conventional wire bonding processes, such as ultrasonic bonding, compression bonding, soldering or other suitable techniques. To facilitate the wire bonding on the depression lead tips 118 at least one of a coining process, an etching process, and combinations thereof can also be applied to flatten the surface of the depression lead tips 118.

The leadframe 102 also has the tie bars 106 located at each corner of the leadframe 102. The number of tie bars 106 connects the number of inner leads 114, the number of outer leads 116, and the die attach paddle 104. The number of tie bars 106 is used to hold the leadframe 102 in place during molding and singulation operations. An outer leadframe (not shown) surrounds the number of inner leads 114 and the number of outer leads 116. The outer leadframe is connected to the number of tie bars 106. After molding, the outer leadframe is removed during the singulation process.

Referring now to FIG. 2, therein is shown an enlarged view 200 of a portion of the structure of FIG. 1 taken along line 2-2. An outer lead 216 and an inner lead stem 215 in the cross-sectional view shown in FIG. 2 are representative of adjoining pairs of the outer leads 116 and the inner lead stems 115 shown in FIG. 1. The outer lead 216 is about twice the thickness of the inner lead stem 215. The outer lead 216 also is about twice the width of the inner lead stem 215. The difference in widths enables closer positioning of the inner leads 114 and the outer leads 116 shown in FIG. 1. It will be apparent to those skilled in the art upon a reading of this description that the relative sizes of the outer lead 216 and the inner lead stem 215 can be varied to accommodate different designs of the semiconductor package system 100.

Referring now to FIG. 3, therein is shown an enlarged view 300 of a portion of the structure of FIG. 1 taken along line 3-3. An outer portion 302 of the depression lead tip 118 is representative of the outer portions of the inner leads 114 shown in FIG. 1. The outer portion 302 of the depression lead tip 118 shown in FIG. 1 is about the same thickness as the thickness of the outer lead 216 shown in FIG. 2.

Referring now to FIG. 4, therein is shown an enlarged view 400 of a portion of the structure of FIG. 1 taken along line 4-4. A depression lead tip 418 is representative of the depression lead tips 118 shown in FIG. 1. The depression lead tip 418 has a thickness less than the thickness of the outer lead 216 and a width substantially equal to the width of the outer lead 216 shown in FIG. 2.

Referring now to FIG. 5, therein is shown an enlarged cross-sectional view 500 of a portion of the structure of FIG. 1 taken along line 5-5. The die attach paddle 104 and the inner leads 114 typically have a conductive plating layer 502 and 504 respectively. The conductive plating layers 502 and 504 typically are formed of an electrically conductive wettable material, such as copper or a solder material. The die 108 is electrically connected to the inner leads 114 by the bond wires 120. The bond wires 120 are connected between the bonding pads 112 and the conductive plating layer 504 on upper surface of the depression lead tips 118. The bond wires 120 can be alternatively wire bonded to the conductive plating layer 504 on the depression lead tip 118 or on the upper surface of the outer portion 302, shown in FIG. 3, of the inner leads 114. The bond wires 120 are bonded using a conventional manner of at least one of ultrasonic bonding, thermosonic bonding, soldering, and combinations thereof using wire bonding equipment readily available in the semiconductor industry.

The use of low loop wire-bonding techniques and the depression lead tips 118 on the inner leads 114 provides the ability to maintain a wire separation 506 between two adjacent wires that is greater thereby reducing the likelihood of electrical shorts caused by wire crossing. Additionally, the chances of wire sweep can be reduced.

The die attach paddle 104, the die 108, the bond wires 120, the inner leads 114 and the outer leads 116 are encapsulated using an encapsulant 508, such as an epoxy molding compound.

Figure 6:
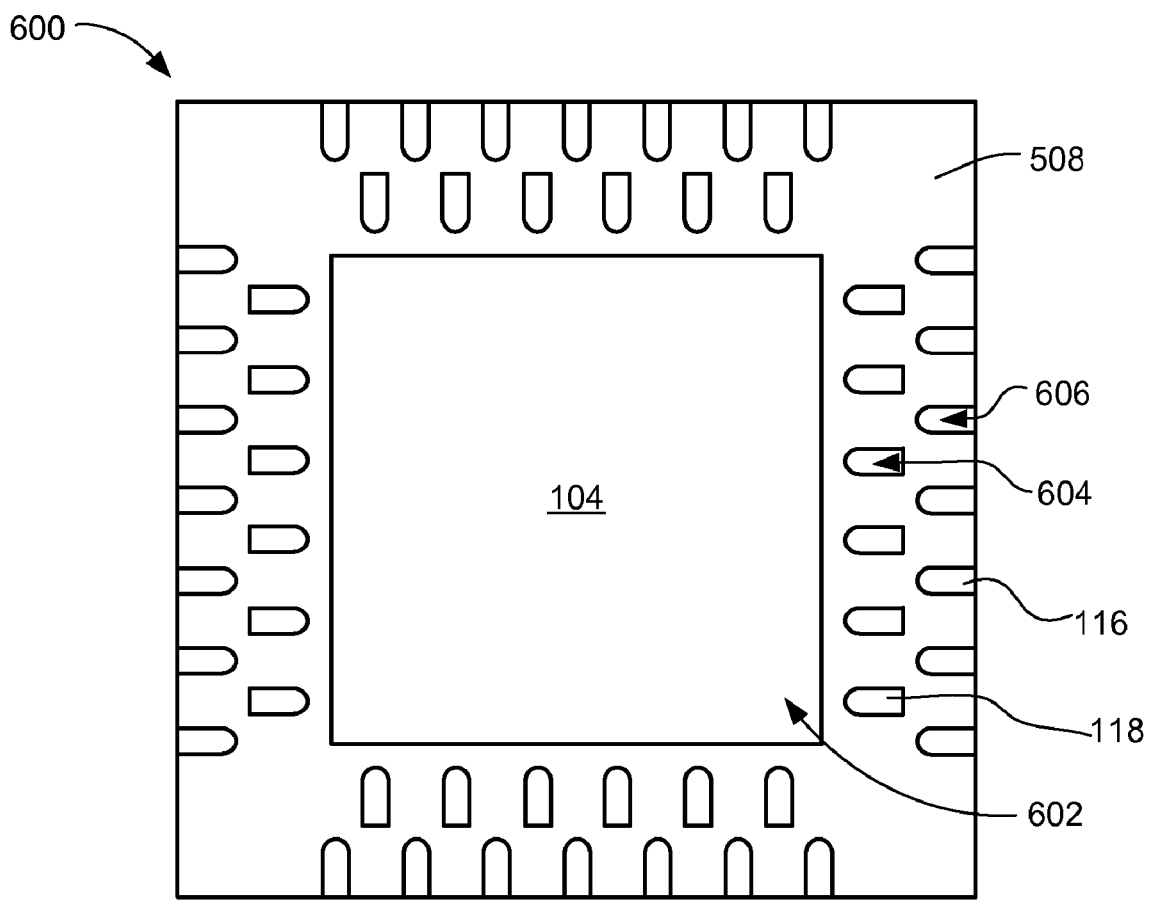
FIG. 6 is a bottom view of the structure of FIG. 1.

Referring now to FIG. 6, therein is shown a bottom view 600 of the structure of FIG. 1. A lower surface 602 of the die attach paddle 104, a lower surface 604 of the depression lead tips 118, and a lower surface 606 of the outer leads 116 are exposed through the encapsulant 508 shown in FIG. 5. Accordingly, a conventional flat base heater block can be used for lead frame clamping and providing a suitable wire bonding temperature to the die attach paddle 104, the depression lead tips 118 and the outer leads 116 during wire bonding.

Figure 7:
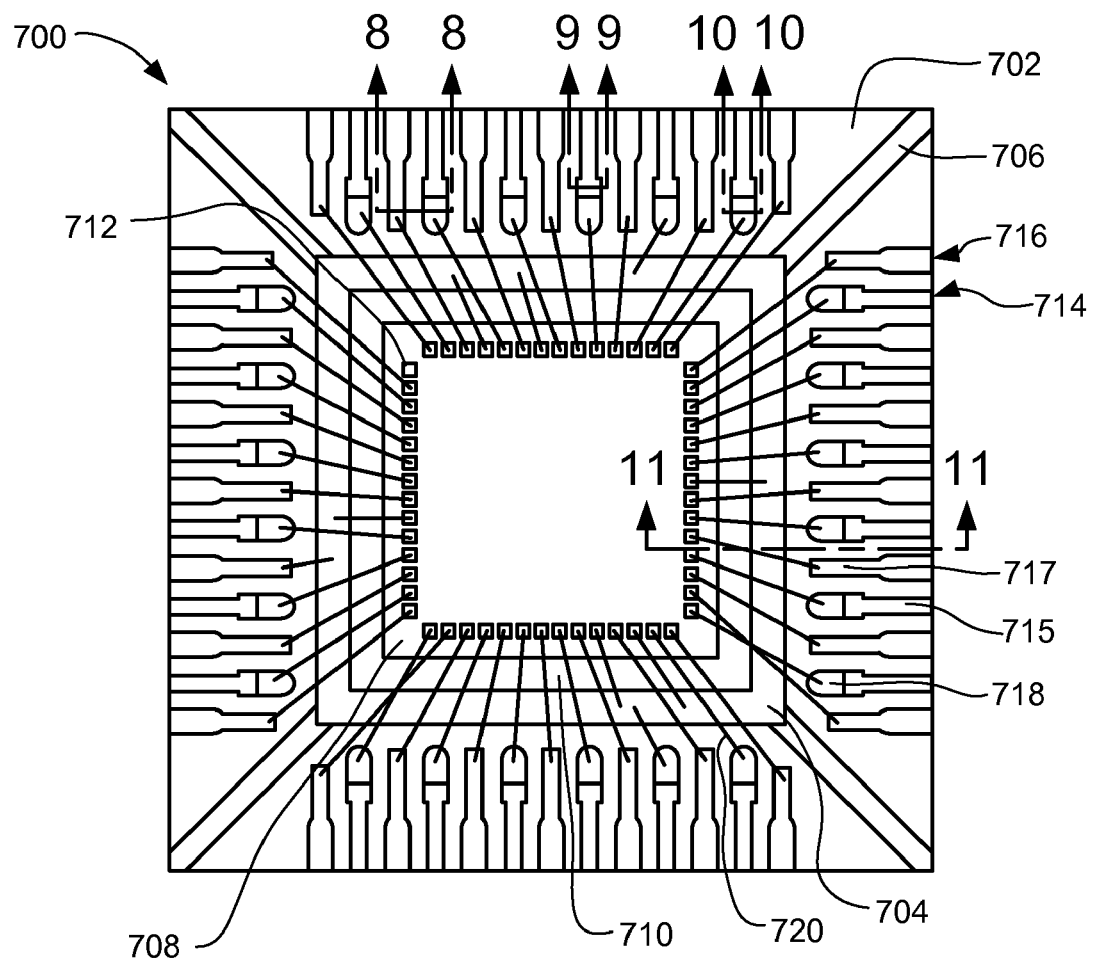
FIG. 7 is a plan view of a semiconductor package system at an intermediate stage of manufacture in accordance with an embodiment of the present invention.

Referring now to FIG. 7, therein is shown a plan view of a semiconductor package system 700 at an intermediate stage of manufacture in accordance with an embodiment of the present invention. The semiconductor package system 700 has a leadframe 702. The leadframe 702 includes a die attach paddle 704 centrally located in the leadframe 702. The die attach paddle 704 is connected to the leadframe 702 by a number of tie bars 706 attached to the corners of the die attach paddle 704. A die 708 is attached to the die attach paddle 704 using a die attach adhesive 710. The die attach adhesive 710 is applied to the die attach paddle 704 in a conventional manner such as by applying an adhesive tape or dispensing an adhesive liquid or paste that is subsequently cured. The die attach adhesive 710 can be either electrically conductive or non-conductive as required in a particular application. The die 708 has a number of bonding pads 712 positioned around the outer edge of the die 708.

A number of inner leads 714 is positioned around the periphery of the die attach paddle 704. Interleaved between the inner leads 714 is a number of outer leads 716. The outer leads 716 have a number of extended lead tips 717 attached thereto. The outer leads 716 comprise a first plurality of leads, and the inner leads 714 comprise a second plurality of leads. The innermost ends of the extended lead tips 717 are aligned with the innermost ends of a number of depression lead tips 718 on the inner leads 714. The inner leads 714 include a number of inner lead stems 715 and the number of depression lead tips 718 attached thereto. The depression lead tips 718 are formed during the process of manufacturing the leadframe 702, such as by etching.

The bonding pads 712 on the die 708 are electrically connected to the inner leads 714, the outer leads 716, and the die attach paddle 704 as required for the semiconductor package 700 by a number of bond wires 720 depending upon the particular design. Each of the number of bond wires 720 is a fine, conductive wire, such as gold (Au), aluminum (Al), or other conductive wire. The number of bond wires 720 is attached between the number of bonding pads 712 on one hand, and the inner leads 714, the outer leads 716, and the die attach paddle 704 on the other hand, using conventional wire bonding processes, such as ultrasonic bonding, compression bonding, soldering or other suitable techniques. To facilitate the wire bonding on the depression lead tips 718 at least one of a coining process, an etching process, and combinations thereof can also be applied to flatten the surface of the depression lead tips 718. The use of the extended lead tips 717 on the outer leads 716 enables the use of shorter bond wires 720 for connecting to the outer leads 716.

The leadframe 702 also has the tie bars 706 located at each corner of the leadframe 702. The number of tie bars 706 connects the number of inner leads 714, the number of outer leads 716, and the die attach paddle 704. The number of tie bars 706 is used to hold the leadframe 702 in place during molding and singulation operations. An outer leadframe (not shown) surrounds the number of inner leads 714 and the number of outer leads 716. The outer leadframe is connected to the number of tie bars 706. After molding, the outer leadframe is removed during the singulation process.

Figure 8:
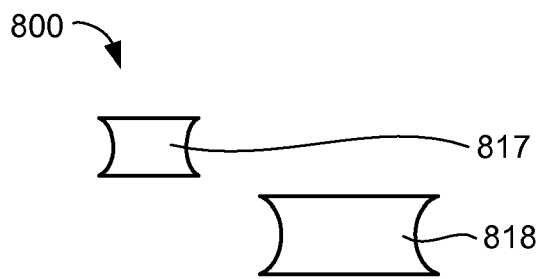
FIG. 8 is an enlarged view of a portion of the structure of FIG. 7 taken along line 8-8.

Referring now to FIG. 8, therein is shown an enlarged view 800 of a portion of the structure of FIG. 7 taken along line 8-8. The extended lead tip 817 and the depression lead tip 818 shown in the cross-sectional view shown in FIG. 8 are representative of adjoining pairs of the extended lead tips 717 and the depression lead tips 718 shown in FIG. 7. The extended lead tip 817 is about the same thickness as the depression lead tip 818. The extended lead tip 817 also is about half the width of the depression lead tip 818. The difference in widths enables closer positioning of the inner leads 714 and the outer leads 716 shown in FIG. 7. It will be apparent to those skilled in the art upon a reading of this description that the relative sizes of the extended lead tip 817 and the depression lead tip 818 can be varied to accommodate different designs of the semiconductor package system 700.

Figure 9:
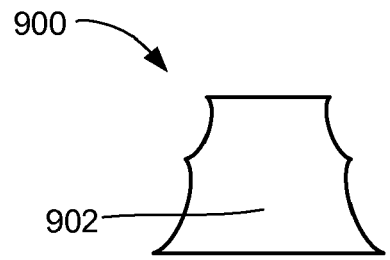
FIG. 9 is an enlarged view of a portion of the structure of FIG. 7 taken along line 9-9.

Referring now to FIG. 9, therein is shown an enlarged view 900 of a portion of the structure of FIG. 7 taken along line 9-9. An outer portion 902 of the depression lead tip 718 is representative of the outer portions of the depression lead tips 718 shown in FIG. 7. The outer portion 902 of the depression lead tip 718 shown in FIG. 7 is about twice the thickness as the thickness of the depression lead tip 818 shown in FIG. 8.

Figure 10:
FIG. 10 is an enlarged view of a portion of the structure of FIG. 7 taken along line 10-10.

Referring now to FIG. 10, therein is shown an enlarged view 1000 of a portion of the structure of FIG. 7 taken along line 10-10. A depression lead tip 1018 is representative of the depression lead tips 718 shown in FIG. 7. The depression lead tip 1018 has a thickness less than the thickness of the outer portion 902 shown in FIG. 9.

Figure 11:
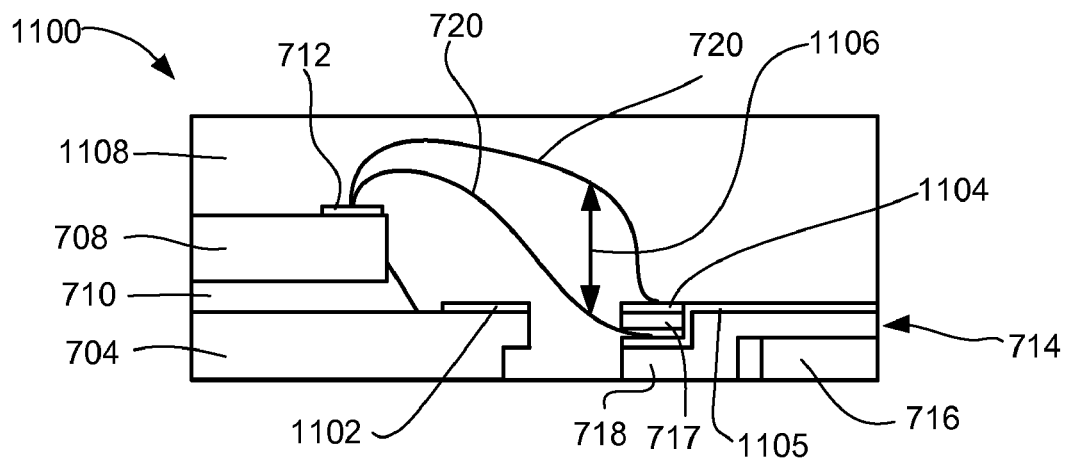
FIG. 11 is an enlarged view of a portion of the structure of FIG. 7 taken along line 11-11.

Referring now to FIG. 11, therein is shown an enlarged cross-sectional view 500 of a portion of the structure of FIG. 7 taken along line 11-11. The die attach paddle 704, the extended lead tips 717, and the inner leads 714 typically have a conductive plating layer 1102, 1104, and 1105 respectively. The conductive plating layers 1102, 1104, and 1105 typically are formed of an electrically conductive wettable material, such as copper or a solder material. The die 708 is electrically connected to the inner leads 714 by the bond wires 720. The bond wires 720 are connected between the wire bonding pads 712 and the conductive plating layer 1104 on upper surface of the extended lead tips 717. The bond wires 720 can be alternatively wire bonded to the conductive plating layer 1104 on the extended lead tip 717 or on the upper surface of the outer portion 902, shown in FIG. 9, of the inner leads 714. The bond wires 720 are bonded using a conventional manner of at least one of ultrasonic bonding, thermosonic bonding, soldering, and combinations thereof using wire bonding equipment readily available in the semiconductor industry.

The use of low loop wire-bonding techniques and the depression lead tips 718 on the inner leads 714 provides the ability to maintain a wire separation 1106 between two adjacent wires that is greater thereby reducing the likelihood of electrical shorts caused by wire crossing. Additionally, the chances of wire sweep can be reduced.

The die attach paddle 704, the die 708, the bond wires 720, the inner leads 714 and the outer leads 716 are encapsulated using an encapsulant 1108, such as an epoxy molding compound.

Figure 12:
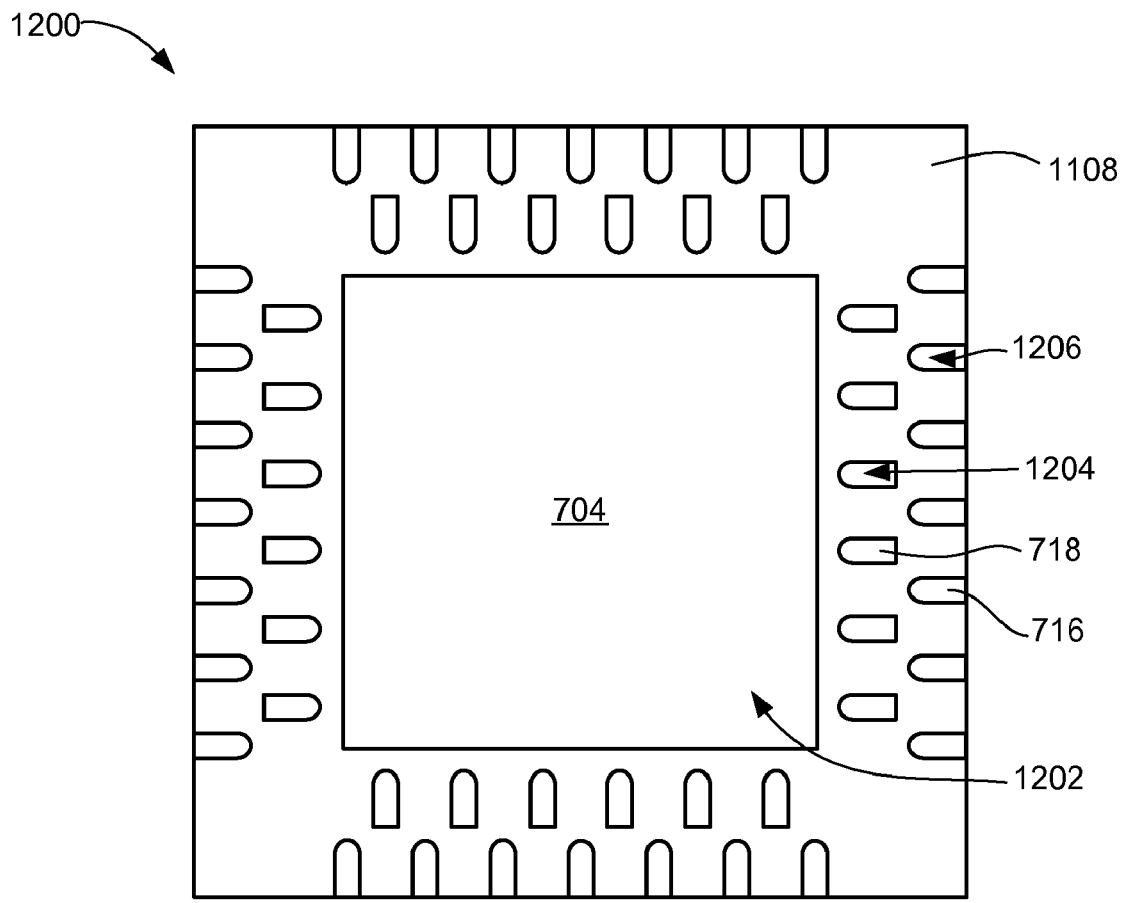
FIG. 12 is a bottom view of the structure of FIG. 7.

Referring now to FIG. 12, therein is shown a bottom view 1200 of the structure of FIG. 7. A lower surface 1202 of the die attach paddle 704, a lower surface 1204 of the depression lead tips 718, and a lower surface 1206 of the outer leads 716 are exposed through the encapsulant 1108 shown in FIG. 11. Accordingly, a conventional flat base heater block can be used for lead frame clamping and providing a suitable wire bonding temperature to the die attach paddle 704, the depression lead tips 718 and the outer leads 716 during wire bonding.

Figure 13:
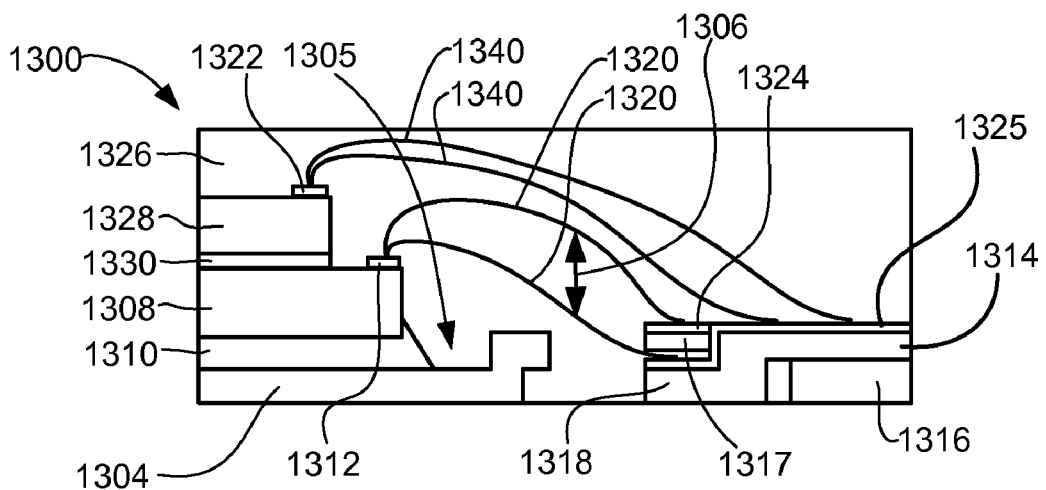
FIG. 13 is an enlarged cross-sectional view of an embodiment of the present invention having stacked dies.

Referring now to FIG. 13, therein is shown an enlarged cross-sectional view 1300 of a portion of an embodiment of the present invention having stacked dies. A die attach paddle 1304 has a recessed portion 1305 that is formed, such as by etching, during the manufacture of the lead frame. A first die 1308 is attached to the recessed portion 1305 of the die attach paddle 1304 using a first die attach adhesive 1310. A second die 1328 is attached to the upper surface of the first die 1308 using a second die attach adhesive 1330. An extended lead tip 1317 and an inner lead 1314 typically have a conductive plating layer 1324 and 1325 respectively. The conductive plating layers 1324 and 1325 typically are formed of an electrically conductive wettable material, such as copper or a solder material.

The first die 1308 is electrically connected to the extended lead tip 1317 and a depression lead tip 1318 on the inner lead 1314 by a first number of bond wires 1320. One of the first bond wires 1320 is connected between a first bonding pad 1312 and the conductive plating layer 1324 on the upper surface of the extended lead tip 1317. The outer of the first bond wires 1320 is connected between the first bonding pad 1312 and the conductive plating layer 1325 on the depression lead tip 1318.

The second die 1328 is electrically connected to the thick portion of the inner lead tips 1314 and the outer leads 1316 by a second number of bond wires 1340. One of the second bond wires 1340 is connected between the second bonding pad 1322 and the conductive plating layer 1324 on the upper surface of the extended lead tip 1317. The other of the second bond wires 1340 is connected between the second bonding pad 1322 and the conductive plating layer 1325 on the thick portion of the inner lead 1314.

The first bond wires 1320 and the second bond wires 1340 are bonded using a conventional manner of at least one of ultrasonic bonding, thermosonic bonding, soldering, and combinations thereof using wire bonding equipment readily available in the semiconductor industry.

The use of low loop wire-bonding techniques and the depression lead tip 1318 on the inner lead 1314 provides the ability to maintain a wire separation 1306 between two adjacent wires that is greater thereby reducing the likelihood of electrical shorts caused by wire crossing. Additionally, the chances of wire sweep can be reduced.

The die attach paddle 1304, the die 1308, the first bond wires 1320, the second bond wires 1340, the inner lead 1314 and the outer lead 1316 are encapsulated using an encapsulant 1326, such as an epoxy molding compound.

Figure 14:
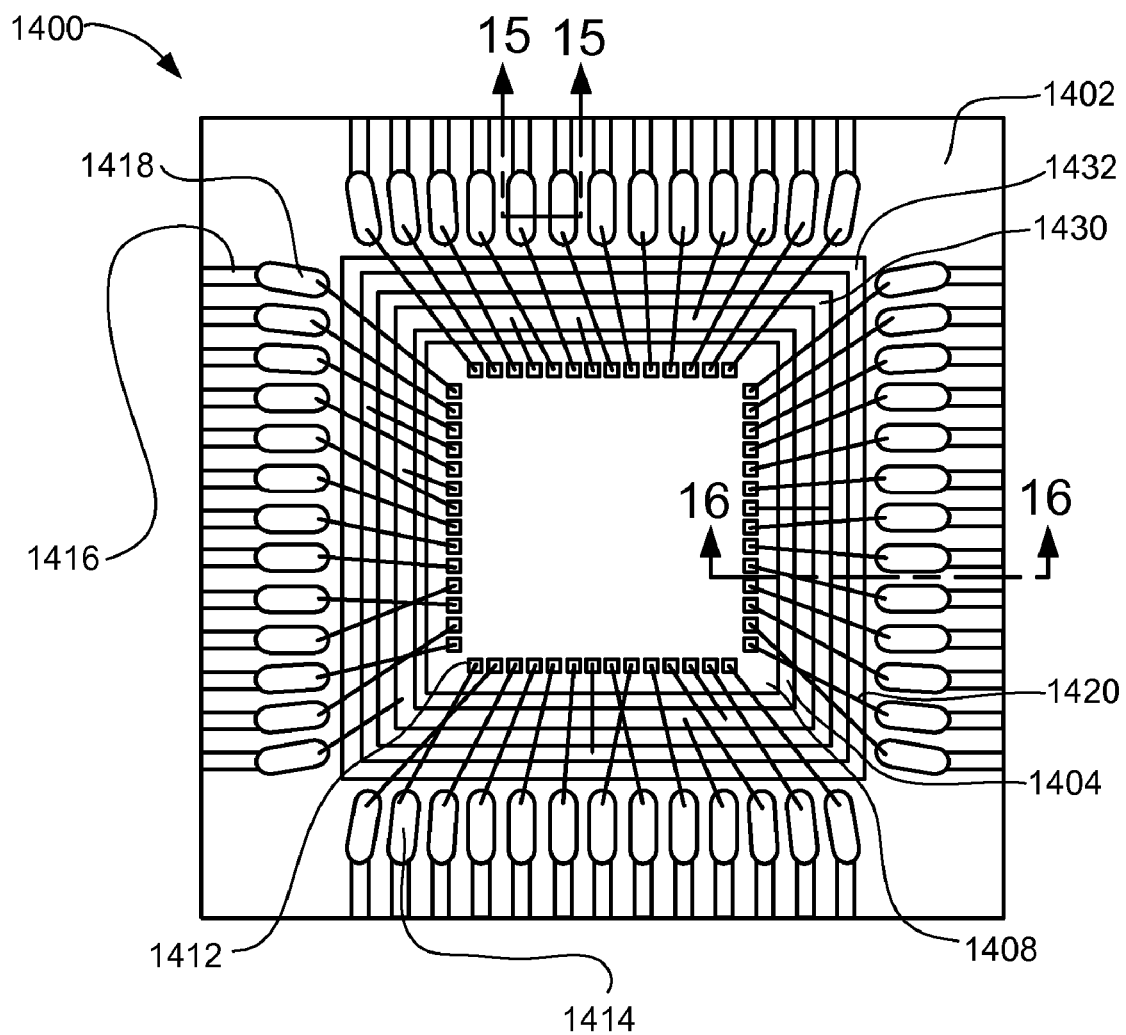
FIG. 14 is a plan view of a semiconductor package system at an intermediate stage of manufacture in accordance with an embodiment of the present invention.

Referring now to FIG. 14, therein is shown a plan view of a semiconductor package system 1400 at an intermediate stage of manufacture in accordance with an embodiment of the present invention. The semiconductor package system 1400 has a substrate 1402. The substrate 1402 includes a die attach paddle 1404 centrally located in the substrate 1402. A die 1408 is attached to the die attach paddle 1404 using a die attach adhesive 1410 (shown in FIG. 16). The die attach adhesive 1410 is applied to the die attach paddle 1404 in a conventional manner such as by applying an adhesive tape or dispensing an adhesive liquid or paste that is subsequently cured. The die attach adhesive 1410 can be either electrically conductive or non-conductive as required in a particular application. The die 1408 has a number of bonding pads 1412 positioned around the outer edge of the die 1408.

A first number of leads 1414 is positioned around the periphery of the die attach paddle 1404. Interleaved between the first number of leads 1414 is a second number of leads 1416. The second number of leads 1416 has a number of depression bond fingers 1418 attached thereto. The depression bond fingers 1418 are formed during the process of manufacturing the substrate 1402, such as by etching.

The bonding pads 1412 on the die 1408 are electrically connected to the first number of leads 1414, the second number of leads 1416, and the die attach paddle 1404 by a number of bond wires 1420 as required for the semiconductor package 1400 of a particular design. Each of the number of bond wires 1420 is a fine, conductive wire, such as gold (Au), aluminum (Al), or other conductive wire. The number of bond wires 1420 is attached between the number of bonding pads 1412 on one hand, and the first number of leads 1414, the second number of leads 1416, and the die attach paddle 1404 on the other hand, using conventional wire bonding processes, such as ultrasonic bonding, compression bonding, soldering or other suitable techniques. To facilitate the wire bonding on the second number of leads 1416 at least one of a coining process, an etching process, and combinations thereof can also be applied to flatten the surface of the second number of leads 1416.

The substrate 1402 also has a first metal ring 1430 and a second metal ring 1432 positioned interior of the inner edge of the first number of leads 1414 and the second number of leads 1416.

Figure 15:
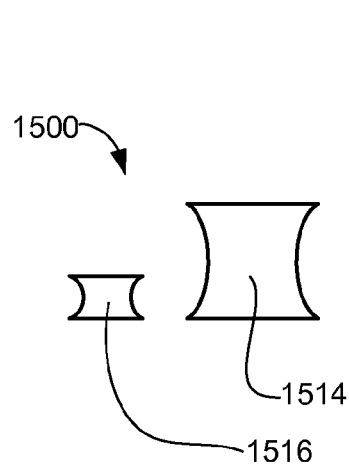
FIG. 15 is an enlarged view of a portion of the structure of FIG. 14 taken along line 15-15.

Referring now to FIG. 15, therein is shown an enlarged view 1500 of a portion of the structure of FIG. 14 taken along line 15-15. A first lead 1514 and a second lead 1516 shown in the cross-sectional view shown in FIG. 15 are representative of adjoining pairs of the first leads 1414 and the second leads 1416 shown in FIG. 14. The first lead 1514 is about the same twice the thickness of the second lead 1516. The first lead 1514 and the second lead 1516 are about the same width. It will be apparent to those skilled in the art upon a reading of this description that the relative sizes of the first lead 1514 and the second lead 1516 can be varied to accommodate different designs of the semiconductor package system 1400.

Figure 16:
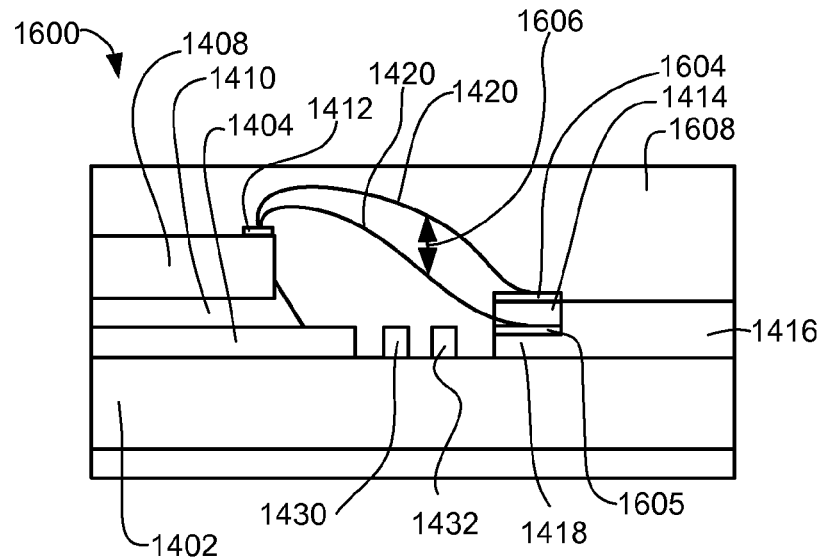
FIG. 16 is an enlarged view of a portion of the structure of FIG. 14 taken along line 16-16.

Referring now to FIG. 16, therein is shown an enlarged cross-sectional view 1600 of a portion of the structure of FIG. 14 taken along line 16-16. The first leads 1414 and the second leads 1416 typically have a conductive plating layer 1604 and 1605 respectively. The conductive plating layers 1604 and 1605 typically are formed of an electrically conductive wettable material, such as copper or a solder material. The die 1408 is electrically connected to the first lead 1414 and the second lead 1416 by the bond wires 1420. The bond wires 1420 are connected between the bonding pad 1412 and the conductive plating layer 1604 on upper surface of the first lead 1414 and the conductive plating layer 1605 on the upper surface of the second lead 1416. The bond wires 1420 are bonded using a conventional manner of at least one of ultrasonic bonding, thermosonic bonding, soldering, and combinations thereof using wire bonding equipment readily available in the semiconductor industry.

The use of low loop wire-bonding techniques and the depression lead tip 1418 on the first lead 1414 enables the wire separation 1606 between two adjacent wires to be greater thereby reducing the likelihood of electrical shorts caused by wire crossing. Additionally, the chances of wire sweep are reduced.

The die attach paddle 1404, the die 1408, the bond wires 1420, the first leads 1414 and the second leads 1416 are encapsulated using a suitable encapsulant 1608, such as an epoxy molding compound.

Figure 17:
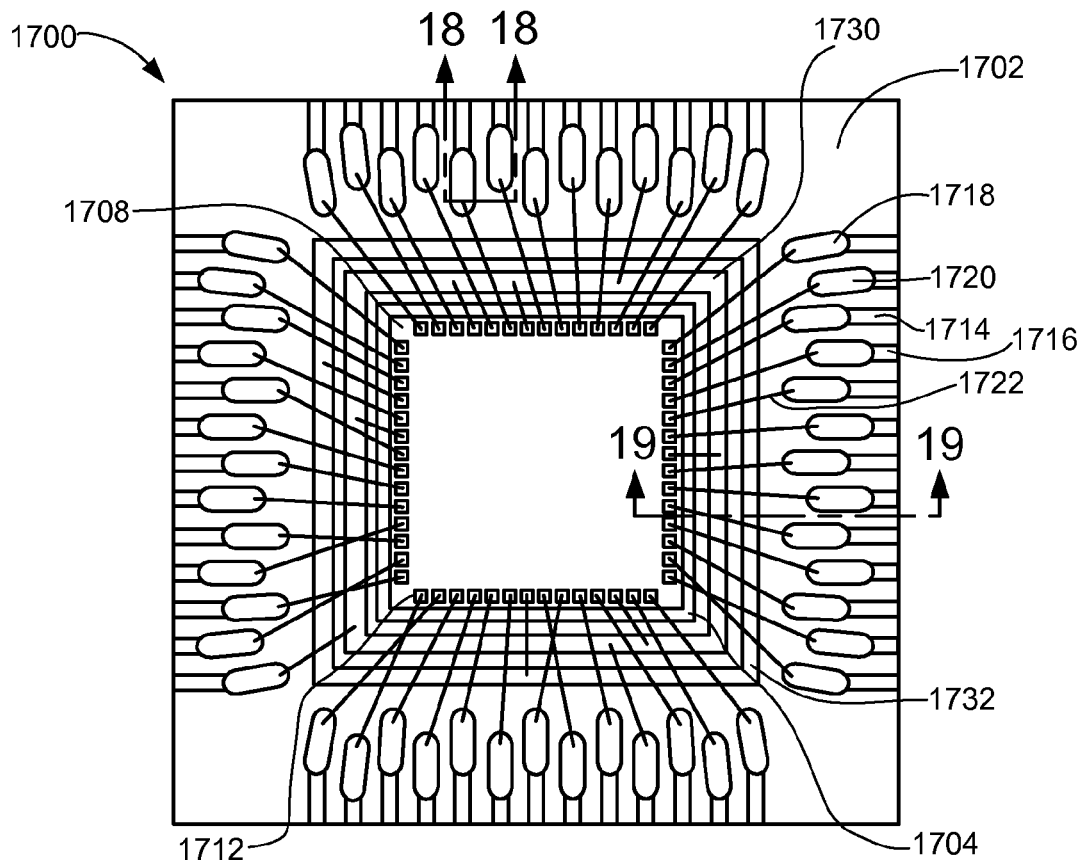
FIG. 17 is a plan view of a semiconductor package system at an intermediate stage of manufacture in accordance with an embodiment of the present invention.

Referring now to FIG. 17, therein is shown a plan view of a semiconductor package system 1700 at an intermediate stage of manufacture in accordance with an embodiment of the present invention. The semiconductor package system 1700 has a substrate 1702. The substrate 1702 includes a die attach paddle 1704 centrally located in the substrate 1702. A die 1708 is attached to the die attach paddle 1704 using a die attach adhesive (not shown). The die attach adhesive is applied to the die attach paddle 1704 in a conventional manner such as by applying an adhesive tape or dispensing an adhesive liquid or paste that is subsequently cured. The die attach adhesive can be either electrically conductive or non-conductive as required in a particular application. The die 1708 has a number of bonding pads 1712 positioned around the outer edge of the die 1708.

A number of inner leads 1714 is positioned around the periphery of the die attach paddle 1704. Interleaved between the inner leads 1714 is a number of outer leads 1716. The inner leads 1714 have a number of depression lead tips 1718 attached thereto. The outer leads 1716 have a number of lead tips 1720 attached thereto. The outer leads 1716 comprise a first plurality of leads, and the inner leads 1714 comprise a second plurality of leads. The depression lead tips 1718 are formed during the process of manufacturing the substrate 1702.

The substrate 1702 also has a first metal ring 1730 and a second metal ring 1732 positioned interior of the inner edge of the inner leads 1714 and the outer leads 1716.

The bonding pads 1712 on the die 1708 are electrically connected to the inner leads 1714, the outer leads 1716, and the die 1708 as required for the semiconductor package system 1700 by a number of bond wires 1722. Each of the number of bond wires 1722 is a fine, conductive wire, such as gold (Au), aluminum (Al), or other conductive wire. The number of bond wires 1722 is attached between the number of bonding pads 1712 on one hand, and the depression lead tips 1718 on the inner leads 1714, the lead tips 1720 on the outer leads 1716, and the bonding pads 1712 on the die 1708 on the other hand, using conventional wire bonding processes, such as ultrasonic bonding, compression bonding, soldering or other suitable techniques. To facilitate the wire bonding on the inner leads 1714 at least one of a coining process, an etching process, and combinations thereof can also be applied to flatten the surface of depression bond fingers 1718 on the inner leads 1714.

Figure 18:
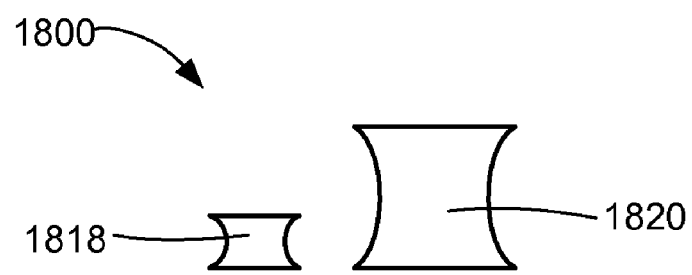
FIG. 18 is an enlarged view of a portion of the structure of FIG. 17 taken along line 18-18.

Referring now to FIG. 18, therein is shown an enlarged view 1800 of a portion of the structure of FIG. 17 taken along line 18-18. A depression lead tip 1818 and a lead tip 1820 shown in the cross-sectional view shown in FIG. 18 are representative of adjoining pairs of the depression lead tips 1718 and the lead tips 1720 shown in FIG. 17. The depression lead tip 1818 is about half the thickness of the lead tip 1820. The depression lead tip 1818 and the lead tip 1820 are about the same width. It will be apparent to those skilled in the art upon a reading of this description that the relative sizes of the depression lead tip 1818 and the lead tip 1820 can be varied to accommodate different designs of the semiconductor package system 1700 shown in FIG. 17.

Figure 19:
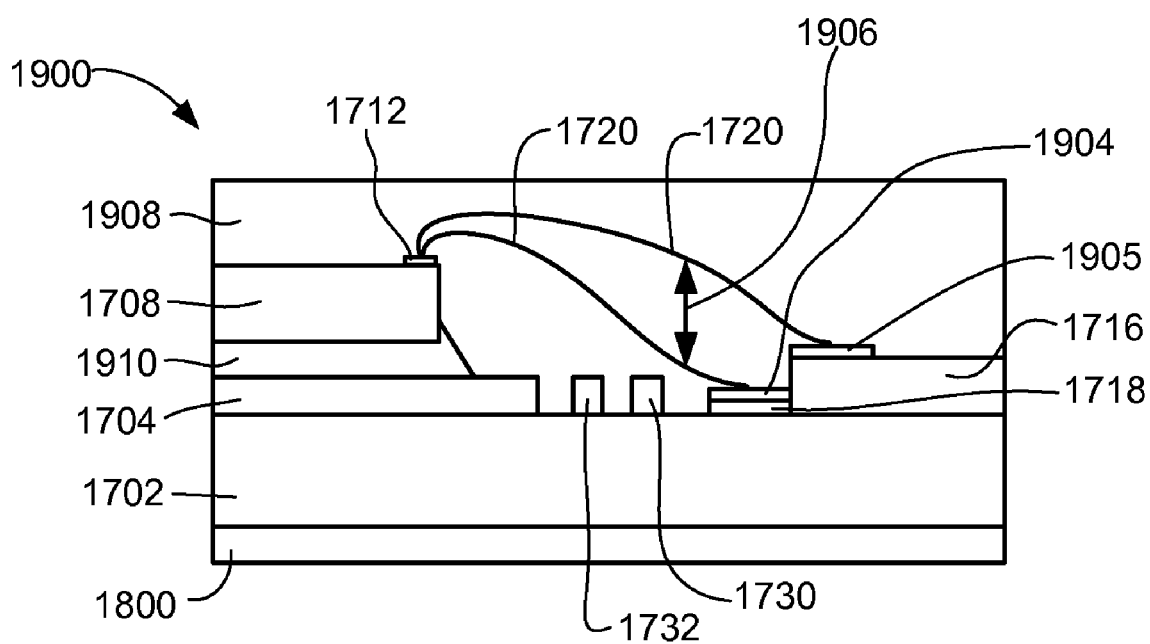
FIG. 19 is an enlarged view of a portion of the structure of FIG. 17 taken along line 19-19.

Referring now to FIG. 19, therein is shown an enlarged cross-sectional view 1900 of a portion of the structure of FIG. 17 taken along line 19-19. The inner leads 1714 and the outer leads 1716 typically have a conductive plating layer 1904, and 1905 respectively. The conductive plating layers 1904 and 1905 typically are formed of an electrically conductive wettable material, such as copper or a solder material. The die 1708 is electrically connected to the outer leads 1716 and the depression lead tips 1718 on inner leads 1714 by the bond wires 1720. The bond wires 1720 are connected between the wire bond pads 1712 and the conductive plating layer 1904 on upper surface of the depression lead tips 1718 on the inner leads 1714 and the conductive plating layer 1905 on upper surface of the outer leads 1716. The bond wires 1720 are bonded using a conventional manner of at least one of ultrasonic bonding, thermosonic bonding, soldering, and combinations thereof using wire bonding equipment readily available in the semiconductor industry.

The use of low loop wire-bonding techniques and the depression lead tips 1718 on the inner leads 1714 enables the wire separation 1906 between two adjacent wires to be greater thereby reducing the likelihood of electrical shorts caused by wire crossing. Additionally, the chances of wire sweep are reduced.

The die attach paddle 1704, the die 1708, the bond wires 1720, the inner leads 1714 and the outer leads 1716 are encapsulated using a suitable encapsulant 1908, such as an epoxy molding compound.

Figure 20:
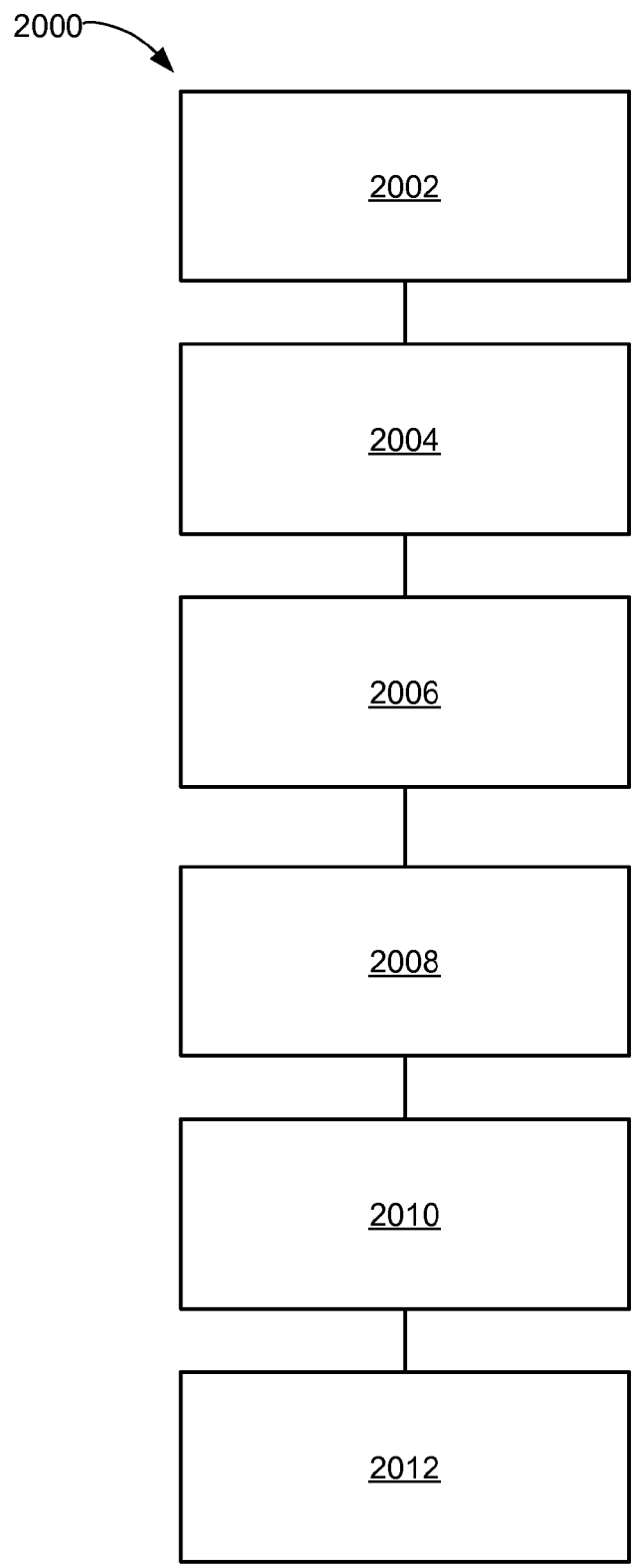
FIG. 20 is a flow chart of a semiconductor package system in accordance with an embodiment of the present invention.

Referring now to FIG. 20, therein is shown a flow chart of a semiconductor package system 2000 in accordance with an embodiment of the present invention. The semiconductor package system 2000 includes providing a substrate having a die attach paddle in a block 2002; providing a first plurality of leads around the die attach paddle having a first plurality of lead tips in a block 2004; providing a second plurality of leads around the die attach paddle interleaved with the first plurality of leads, at least some of the second plurality of leads having a plurality of depression lead tips in a block 2006; attaching a first die to the die attach paddle in a block 2008; wire bonding the die to the first plurality of leads and the second plurality of leads in a block 2010; and encapsulating the die in a block 2012.

Thus, it has been discovered that the method and apparatus of the present invention furnish important and heretofore unavailable solutions, capabilities, and functional advantages for manufacturing a semiconductor package. The resulting process and configurations are straightforward, economical, uncomplicated, highly versatile, and effective, use conventional technologies, and are thus readily suited for manufacturing semiconductor packages that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters heretofore set forth herein or shown in the accompanying drawings are to be interpreted in an illustrative and non-limiting sense.

The invention claimed is:

1. A semiconductor package system comprising:
    providing a die attach paddle;
    providing a first plurality of leads including a plurality of outer leads around the die attach paddle having a first plurality of lead tips;
    providing a second plurality of leads including a plurality of inner leads around the die attach paddle interleaved with the first plurality of leads, at least some of the second plurality of leads having a plurality of depression lead tips;
    attaching a first die to the die attach paddle;
    wire bonding the die to the first plurality of leads and the second plurality of leads; and
    encapsulating the die.

2. The semiconductor package system as claimed in claim 1, further comprising:
    attaching a second die to the first die; and
    wire bonding the second die to the first plurality of leads and the second plurality of leads.

3. The semiconductor package system as claimed in claim 1, wherein:
    providing the plurality of depression lead tips provides a plurality of depression lead tips about half the thickness of the first plurality of lead tips.

4. The semiconductor package system as claimed in claim 1, wherein:
    providing the plurality of depression lead tips uses at least one of a coining process, an etching process, and combinations thereof.

5. A semiconductor package system, comprising:
    providing a die attach paddle;
    providing a plurality of outer leads around the periphery of the die attach paddle;
    providing a plurality of inner leads around the periphery of the die attach paddle;
    providing a plurality of depression lead tips on at least some of the inner leads;
    attaching a first die to the die attach paddle;
    wire bonding the first die to the plurality of outer leads and the plurality of depression lead tips; and
    encapsulating the die, the plurality of outer leads, and the plurality of inner leads.

6. The semiconductor package system as claimed in claim 5, further comprising:
    attaching a second die to the first die; and
    wire bonding the second die to the plurality of outer leads and the plurality of depression lead tips.

7. The semiconductor package system as claimed in claim 5, wherein:
    providing the plurality of depression lead tips provides a plurality of depression lead tips about half the thickness of the outer leads.

8. The semiconductor package system as claimed in claim 5, wherein:
    providing the plurality of depression lead tips uses at least one of a coining process, an etching process, and combinations thereof.

9. The semiconductor package system as claimed in claim 5, further comprising:
    interleaving the plurality of outer leads with the plurality of inner leads.

10. A semiconductor package system comprising:
    a die attach paddle;
    a first plurality of leads provides a plurality of outer leads having a first plurality of lead tips around the die attach paddle;
    a second plurality of leads provides a plurality of inner leads interleaved with the first plurality of leads, at least some of the second plurality of leads having a plurality of depression lead tips;
    a first die attached to the die attach paddle;
    a first plurality of wires bonding the die to the first plurality of leads and the second plurality of leads; and
    an encapsulant encapsulating the die.

11. The semiconductor package system as claimed in claim 10, further comprising:
    a second die attached to the first die; and
    a second plurality of wires bonding the second die to the first plurality of leads and the second plurality of leads.

12. The semiconductor package system as claimed in claim 10, wherein:
    the plurality of depression lead tips comprises a plurality of depression lead tips about half the thickness of the first plurality of lead tips.

13. The semiconductor package system as claimed in claim 10, wherein:
    the plurality of depression lead tips is characterized by having been flattened by coining, etching, or a combination thereof.

14. The semiconductor package system as claimed in claim 10, wherein:
    the first plurality of leads comprises a plurality of outer leads;
    the second plurality of leads comprises a plurality of inner leads; and
    an encapsulant encapsulating the die, the plurality of outer leads, and the plurality of inner leads.

15. The semiconductor package system as claimed in claim 14, further comprising:
    a second die attached to the first die; and
    wires bonding the second die to the plurality of outer leads and the plurality of depression lead tips.

16. The semiconductor package system as claimed in claim 14, wherein:
    the plurality of depression lead tips comprises a plurality of depression lead tips about half the thickness of the outer leads.

17. The semiconductor package system as claimed in claim 14, wherein:
    the plurality of depression lead tips is characterized by having been flattened by coining, etching, or a combination thereof.

18. The semiconductor package system as claimed in claim 14, wherein:
    the plurality of outer leads is interleaved with the plurality of inner leads.

\* \* \* \* \*